(12) United States Patent
Jang

(10) Patent No.: US 8,030,705 B2
(45) Date of Patent: Oct. 4, 2011

(54) SEMICONDUCTOR DEVICE AND METHOD OF FABRICATING THE SAME

(75) Inventor: Byung Tak Jang, Seongnam-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 640 days.

(21) Appl. No.: 12/102,243

(22) Filed: Apr. 14, 2008

(65) Prior Publication Data

US 2008/0258214 A1    Oct. 23, 2008

(30) Foreign Application Priority Data

Apr. 17, 2007    (KR) .................. 10-2007-0037355

(51) Int. Cl.
*H01L 21/00* (2006.01)
(52) U.S. Cl. .................... 257/335; 257/336; 257/337
(58) Field of Classification Search ........... 257/335–337
See application file for complete search history.

(56) References Cited

U.S. PATENT DOCUMENTS

| | | | |
|---|---|---|---|
| 6,320,223 B1 | 11/2001 | Hueting et al. | |
| 6,472,709 B1 * | 10/2002 | Blanchard | 257/343 |
| 6,475,866 B2 * | 11/2002 | Hofmann et al. | 438/270 |
| 6,593,620 B1 * | 7/2003 | Hshieh et al. | 257/335 |
| 6,627,951 B2 * | 9/2003 | Hshieh et al. | 257/335 |
| 6,762,098 B2 * | 7/2004 | Hshieh et al. | 438/269 |
| 6,812,526 B2 * | 11/2004 | Blanchard | 257/343 |
| 6,949,432 B2 * | 9/2005 | Blanchard | 438/259 |
| 7,348,628 B2 * | 3/2008 | Yoon et al. | 257/328 |
| 7,612,408 B2 * | 11/2009 | Zundel et al. | 257/333 |
| 7,700,440 B2 * | 4/2010 | Kao | 438/268 |
| 7,732,876 B2 * | 6/2010 | Grebs et al. | 257/401 |
| 7,781,287 B2 * | 8/2010 | Yoon et al. | 438/272 |
| 7,812,409 B2 * | 10/2010 | Hshieh | 257/401 |
| 2001/0000919 A1 * | 5/2001 | Kocon | 257/330 |
| 2002/0175412 A1 * | 11/2002 | Kocon et al. | 257/750 |
| 2003/0207538 A1 * | 11/2003 | Hshieh et al. | 438/269 |
| 2005/0116267 A1 * | 6/2005 | Zundel et al. | 257/288 |
| 2007/0034911 A1 * | 2/2007 | Kao | 257/288 |
| 2008/0160697 A1 * | 7/2008 | Kao | 438/268 |
| 2008/0258214 A1 * | 10/2008 | Jang | 257/336 |
| 2009/0001485 A1 * | 1/2009 | Kim et al. | 257/408 |
| 2009/0065859 A1 * | 3/2009 | Jang et al. | 257/330 |
| 2009/0095999 A1 * | 4/2009 | Jang | 257/301 |
| 2009/0212357 A1 * | 8/2009 | Risaki | 257/329 |

FOREIGN PATENT DOCUMENTS

JP    11298000 A    10/1999

* cited by examiner

*Primary Examiner* — Laura M Menz
(74) *Attorney, Agent, or Firm* — Saliwanchik, Lloyd & Eisenschenk

(57) ABSTRACT

Provided are a semiconductor device and a method of fabricating the semiconductor device. The semiconductor device can provide a trench MOS transistor having an up-drain structure. The semiconductor device can include a first conductive type well in a semiconductor substrate, a second conductive type well on the first conductive type well, trenches formed by removing portions of the second conductive type well and the first conductive type well; gates provided in the trenches with a gate dielectric being between each gate and the walls of the trench, a first conductive type source region and a second conductive type body region on the second conductive type well, the first conductive type source region surrounding a lateral surface of the gate, and a common drain between the gates, the common drain being connected to the first conductive type well.

9 Claims, 5 Drawing Sheets

SEMICONDUCTOR DEVICE AND METHOD OF FABRICATING THE SAME

CROSS-REFERENCE TO RELATED APPLICATION

The present application claims the benefit under 35 U.S.C. §119 of Korean Patent Application No. 10-2007-0037355, filed Apr. 17, 2007, which is hereby incorporated by reference in its entirety.

BACKGROUND

A trench-type metal-oxide-semiconductor (Trench MOS) transistor can be used as a power transistor.

The power trench MOS transistor distinctly differs from a typical MOS transistor in that a channel of the power trench MOS transistor is formed in a vertical direction, not a horizontal direction.

The power trench MOS transistor includes a vertical channel and a drain formed in a backside of a wafer as an output region.

The power trench MOS transistor is suitable for high-current and high-voltage operation using a small area. To apply a high voltage to the power trench MOS transistor, a lightly doped drain region (a drift region) is formed to a sufficiently large length.

Since electrons move vertically in the power trench MOS transistor, the lightly doped drain region (the drift region) can be vertically formed to increase a withstand voltage without increasing the area of a chip by adjusting a vertical doping profile. Therefore, high withstand-voltage and high-current operation can be possible using a small area.

Since the power trench MOS transistor is typically fabricated using a single layer silicon substrate, the power trench MOS transistor is suitable for a single product. However, the structure of the above described power trench MOS transistor does not easily provide a power trench MOS transistor on the same chip as a MOS transistor.

BRIEF SUMMARY

Embodiments provide a semiconductor device including a trench MOS transistor that can be highly integrated and a method of fabricating the semiconductor device.

In one embodiment, a semiconductor device includes: a first conductive type well in a semiconductor substrate; a second conductive type well on the first conductive type well; first trenches formed by removing portions of the second conductive type well and the first conductive type well; gates provided in the first trenches with a gate dielectric between each gate electrode and walls of the first trench; a first conductive type source region and a second conductive type body region on the second conductive type well, the first conductive type source region surrounding a lateral surface of the gate; and a common drain between the gates, the common drain being connected to the first conductive type well.

In another embodiment, a method of fabricating a semiconductor device includes: sequentially forming a first conductive type well and a second conductive type well in a semiconductor substrate; removing portions of the second conductive type well and the first conductive type well to form a plurality of first trenches; forming a second trench between the first trenches; forming a gate in each first trench; forming a common drain in the second trench; and forming a first conductive type source region and a second conductive type body region on the second conductive type well between the gates and the common drain.

The details of one or more embodiments are set forth in the accompanying drawings and the description below. Other features will be apparent from the description and drawings, and from the claims.

DETAILED DESCRIPTION

A semiconductor device and a method of fabricating the semiconductor device will now be described with reference to the accompanying drawings according to embodiments.

Figure 1:
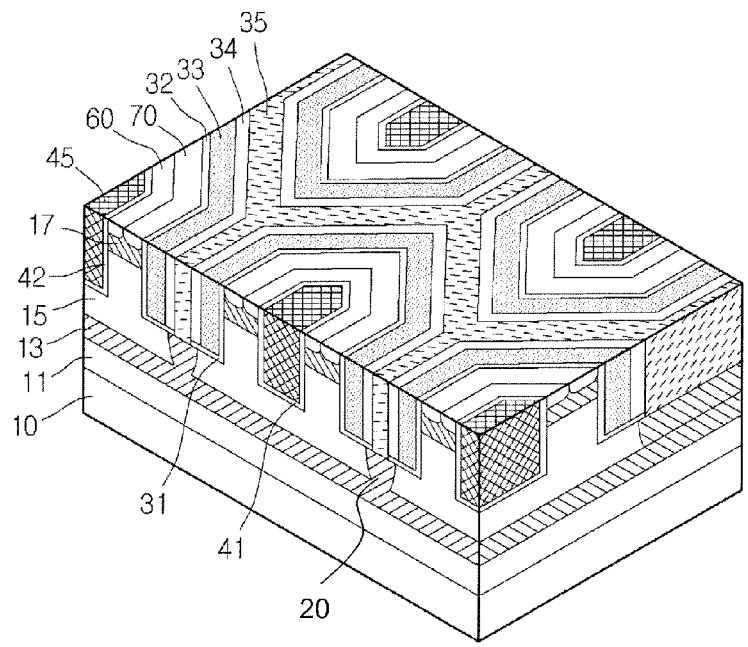
FIG. 1 is a view of a semiconductor device according to an embodiment.

FIG. 1 is a view of a semiconductor device according to an embodiment.

Referring to FIG. 1, a semiconductor device according an embodiment includes a first conductive type deep well 15, a second conductive type shallow well 17, a plurality of gate electrodes 45, a source region 60, a second conductive type body region 70, and a common drain 35. The first conductive type deep well 15 is disposed on a semiconductor substrate 10. The second conductive type shallow well 17 is disposed on the first conductive type deep well 15. The plurality of gate electrodes 45 can be formed in trenches 41 provided by selective removal of portions of the second conductive shallow well 17 and the first conductive type deep well 15. A gate dielectric 42 is disposed between the gate electrode 45 and the walls of the trench 41. The source region 60 and the second conductive type body region 70 are disposed on the second conductive type shallow well 17. The source region 60 can surround a lateral surface of the gate electrode 45. The common drain 35 is disposed between the gate electrodes 45. The common drain 35 can connect with the first conductive type deep well 15. In one embodiment, the common drain 35 can be in contact with the first conductive type deep well 15.

According to an embodiment where the first conductive type is N-type and the second conductive type is P-type, the semiconductor substrate 10 can include a p-type substrate, and a p-epitaxial layer 11 disposed on the semiconductor substrate 10.

In addition, N-type impurity ions can be implanted at high concentration to form a first conductive type deep well 15, and P-type impurity ions can be implanted at high concentration to form a second conductive type shallow well 17.

The common drain 35 can be formed in a second trench 31 provided by selective removal of portions of the second type shallow well 17 and the first conductive deep well 15. A first dielectric 32 can surround the common drain 35 in the second trench 31. A portion of a lower region of the common drain 35 can be in contact with the first conductive type deep well 15.

In a further embodiment, a drain polysilicon layer 33, and a second dielectric 34 can also be provided to surround the common drain 35 in the second trench 31 as illustrated in FIG. 1.

In an embodiment, high-concentration first conductive type material can be deposited to form the common drain 35. For example, a material comprising high-concentration N-type impurity ions can be deposited using a chemical vapor deposition (CVD) process to form the common drain 35.

The gate dielectric 42 of the gate electrode 45 can be formed of the same material as the first and second dielectrics 32 and 34 of the common drain 35. For example, the gate dielectric 42, the first dielectric 32, and second dielectric 34 can include a thermal oxide layer. The second dielectric 34 can include an oxide layer.

According to certain embodiments, the gate electrode 45 can have a hexagonal shape, and the common drain 35 can be disposed between the gate electrodes 45.

A high-concentration first conductive type buried layer 13 can be provided between the semiconductor substrate 10 and the first conductive type deep well 15.

In an embodiment, a high-concentration first conductive type plug 20 can be disposed between the common drain 35 and the first conductive type buried layer 13.

The semiconductor device according to an embodiment includes a common drain 35 having an up-drain structure to provide low output resistance and high frequency characteristic. An up-drain structure is one in which a drain is in the same plane as other elements.

Since the common drain 35 is disposed between the gate electrodes 45, a current path is very short, thereby achieving a low output resistance using a small area.

According to many embodiments comprising a gate cell having a hexagonal shape and a common drain 35 disposed between the gate electrodes 45, the semiconductor device can be highly integrated.

FIGS. 2 to 9 are views illustrating a process of fabricating a semiconductor device according to an embodiment.

Figure 2:
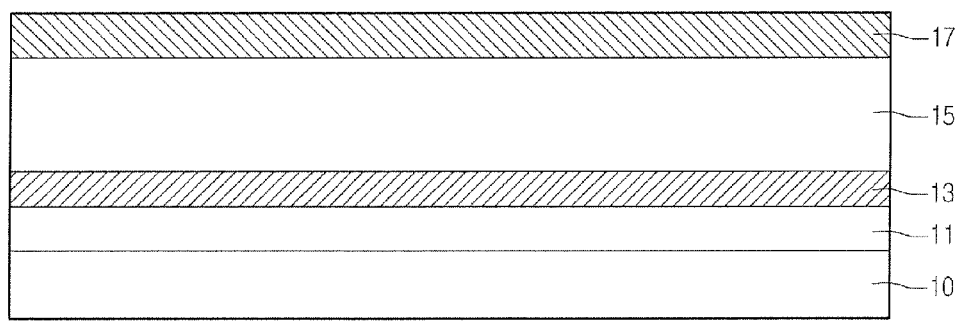
FIGS. 2 to 9 are views illustrating a process of fabricating a semiconductor device according to an embodiment.

Referring to FIG. 2, first conductive type impurity ions can be implanted at high concentration into a semiconductor substrate 10 to form a first conductive type buried layer 13. In many embodiments, the semiconductor substrate 10 can include an epitaxial layer 11.

In one embodiment, the semiconductor substrate 10 can include a P-type substrate, and the epitaxial layer 11 can be a P-epitaxial layer. Hereinafter, the epitaxial layer 11 will be referred to as the P-epitaxial layer.

The first conductive type buried layer 13 can be an N-type buried layer. According to one embodiment, N-type impurity ions can be implanted at high concentration into the semiconductor substrate 10 including the P-epitaxial layer 11 to form the first conductivity type buried layer 13. According to another embodiment, N-type impurity ions can be implanted at high concentration into the semiconductor substrate 10 before growing the P-epitaxial layer 11 to form the first conductive type buried layer 13. In such an embodiment, when the semiconductor substrate 10 with the high-concentration N-type impurity ions implanted therein is grown to form an epitaxial layer, the first conductive type buried layer 13 is disposed between the semiconductor substrate 10 and the P-epitaxial layer 11.

The first conductive type buried layer 13 can effectively reduce the resistance of a drain to be formed in a subsequent process. In certain embodiments, the first conductive type buried layer 13 can be omitted so as to simplify fabricating processes of the semiconductor device according to an embodiment.

Referring again to FIG. 2, a first conductive type deep well 15 can be formed on the first conductive type buried layer 13. The first conductive type deep well 15 can be formed by implanting first conductive type impurity ions into the P-epitaxial layer 11 including the first conductive type buried layer 13. In one embodiment, the first conductive type impurity ions can include N-type impurity ions. The N-type impurity ions can be implanted at a high energy to form the first conductive type deep well 15.

A second conductive type shallow well 17 can be formed on the first conductive type deep well 15. The second conductive type shallow well 17 can be formed by implanting second conductive type impurity ions into the first conductive type deep well 15. In one embodiment, the second conductive type impurity ions can include P-type impurity ions. The P-type impurity ions can be implanted at a relatively low energy compared to the N-type impurity ion implantation.

As illustrated in FIG. 2, the first conductive type deep well 15 and the second conductive type shallow well 17 are sequentially stacked on the semiconductor substrate 10.

Figure 3:
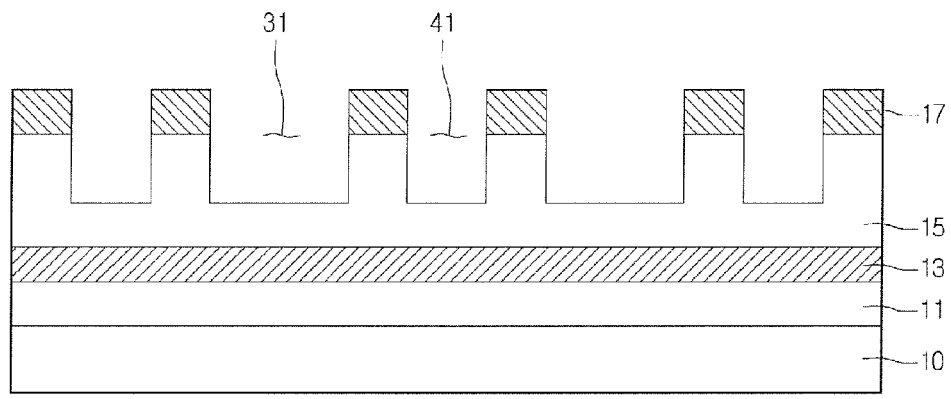

Referring to FIG. 3, portions of the semiconductor substrate 10 can be selectively removed to form a first trench 41 and a second trench 31. The removed portions of the semiconductor substrate 10 can be regions of the second conductive type shallow well 17 and a portion of the first conductive type deep well 15 disposed under the second conductive type shallow well 17. The first trench 41 is provided for forming a gate, and the second trench 31 is provided for forming the drain.

According to one embodiment, a plurality of first trenches 41 can be formed, and then the second trench 31 can be disposed between first the trenches 41. In an embodiment, the first and second trenches can be simultaneously formed.

The first trench 41 can have a hexagonal shape (in plan view) as illustrated in FIG. 1. In another embodiment example, the first trench 41 can have a tetragonal shape. According to certain embodiments, the second trench 31 can have a width ranging from about 1.5 to about 3 times the width of the first trench 41.

Side surfaces of the second trench 31 can correspond to side surfaces of the first trench 41, such as shown in FIG. 1. Hence, the common drain 35 between gates can be commonly used. Therefore, a semiconductor device can be highly integrated, and a current path between a source and the common drain 35 can be very short, thereby reducing output resistance.

Figure 4:
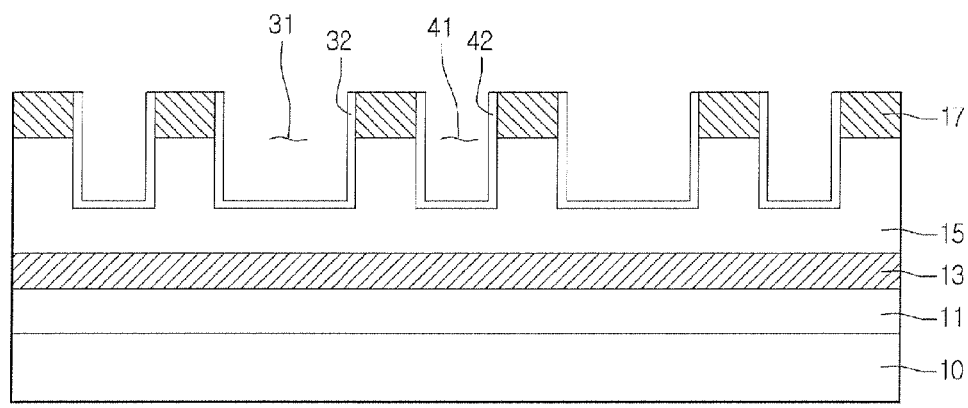

Referring to FIG. 4, a dielectric can be deposited in the first trench 41 and the second trench 31 to form a gate dielectric 42 and a first dielectric 32, respectively. The gate dielectric 42 and the first dielectric 32 can include a thermal oxide layer. The gate dielectric 42 and the first dielectric 32 can be formed at the same time.

Figure 5:
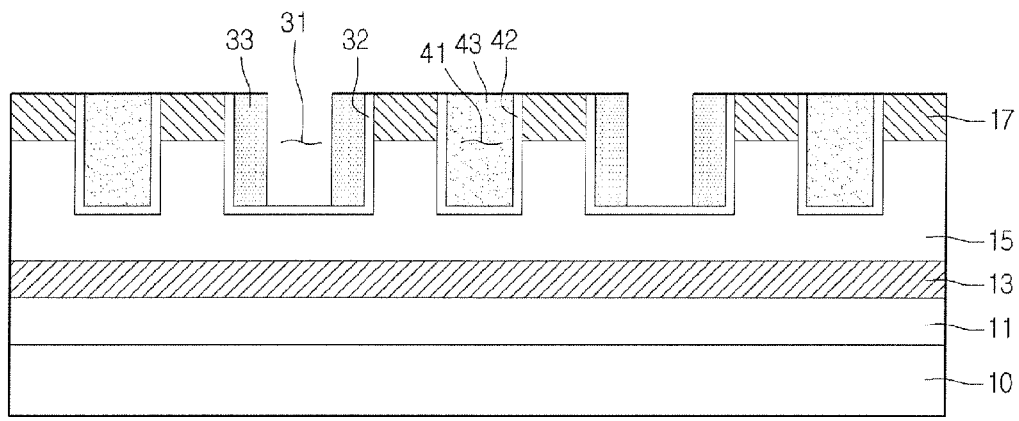

Referring to FIG. 5, a polysilicon layer 43 can be formed in the first trench 41 having the gate dielectric 42. The polysilicon layer 43 can include a non-doped polysilicon. In an embodiment, the first trench 41 can be filled with a polysilicon layer 43 using a chemical vapor deposition (CVD) method.

Polysilicon can also be deposited in the second trench 31 during the process of forming the polysilicon layer 43 in the first trench 41. That is, a drain polysilicon layer 33 can be formed in the second trench 31 having the first dielectric 32.

Since the second trench 31 has a width greater than that of the first trench 41, only the sidewalls and a bottom surface of the second trench 31 are provided with the drain polysilicon layer 43 even though the first trench 41 is completely filled with the polysilicon layer 43. Here, when the first trench 41 is completely filled with the polysilicon, a space having a sufficient width remains open in the second trench 31.

The drain polysilicon layer 33 remaining on the bottom surface of the second trench 31 can be removed by an ion-etching method to expose the first dielectric 32 at the bottom surface of the second trench 31.

Figure 6:
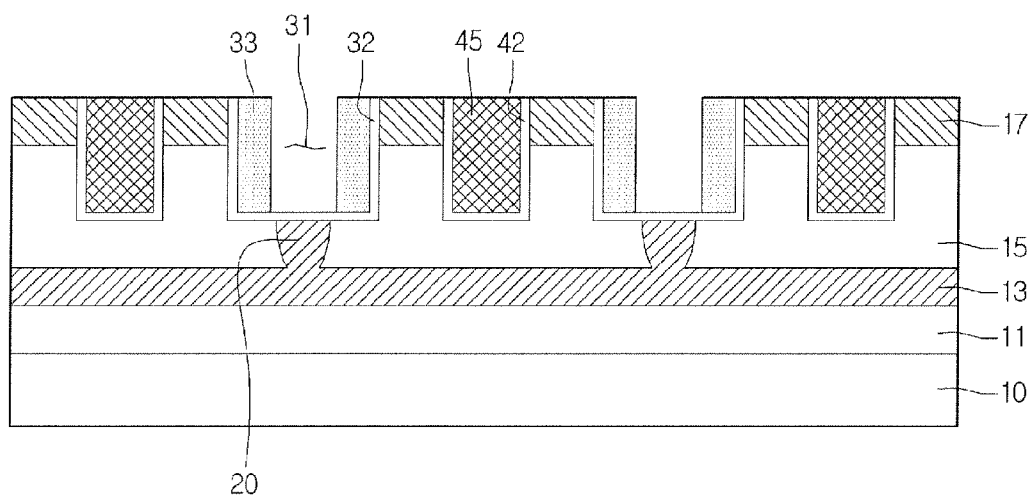

Referring to FIG. 6, to form the gate, first conductive type impurity ions can be implanted into the polysilicon layer 43 filled in the first trench 41, and then the ion-implanted polysilicon layer is heat-treated to form a gate electrode 45. For example, the first conductive type impurity ions can include N-type impurity ions. That is, the N-type impurity ions can be implanted into the polysilicon layer 43 using an ion implantation method and then the ion implanted polysilicon layer is heat-treated to form the gate electrode 45.

When the gate electrode is formed, a first conductive type impurity ion implantation process and a heat treatment process can be performed in the second trench 31 at the same time. At this point, since the first dielectric 32 of the bottom surface of the second trench 31 is exposed, the first conductive type impurity ions can be implanted into the first conductive type deep well 15.

Hence, a first conductive type plug 20 is formed in the first conductive type deep well 15 under the second trench 31. The first conductive type plug 20 can be connected to the first conductive type buried layer 13.

The output resistance of the common drain 35 formed on the first conductive type plug 20 in a subsequent process can be reduced because the first conductive type plug 20 is connected to the first conductive type buried layer 13.

Figure 7:
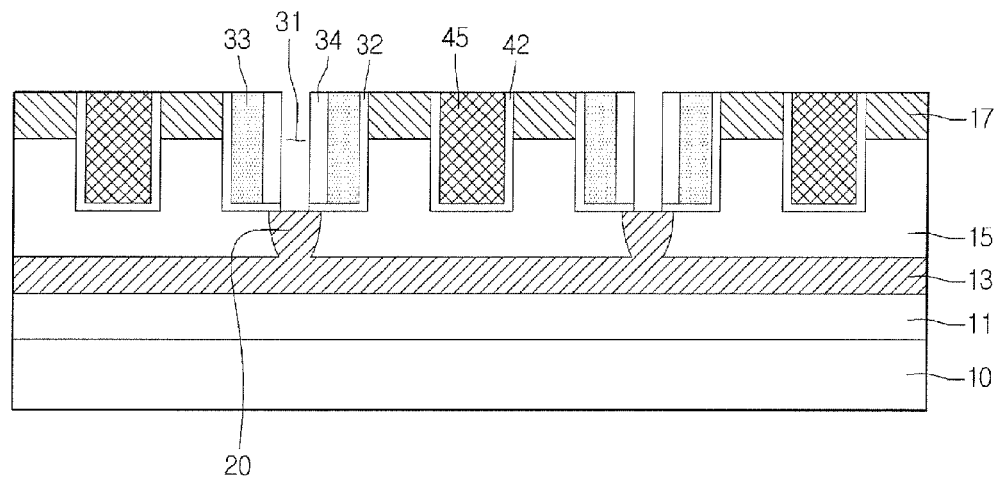

Referring to FIG. 7, a second dielectric 34 can be formed in the second trench 31. For example, a silicon oxide can be deposited on the semiconductor substrate 10 using a CVD method to form the second dielectric 34. Then, portions of the second dielectric 34 are removed by an ion etching method such that the first conductive type plug 20 is exposed and the second dielectric 34 remains on the sidewalls of the drain polysilicon layer 43.

Figure 9:
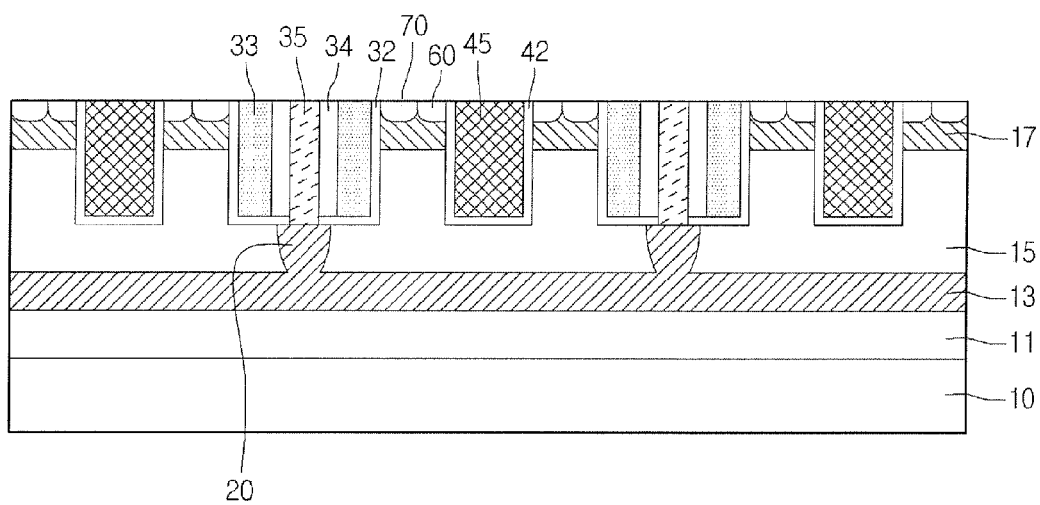

The second dielectric 34 can be used to reduce parasitic capacitance between the common drain 35 formed in the second trench 31 and body regions 70 (refer to FIG. 9). In addition, the second dielectric 34 can increase an insulation voltage.

A portion of the first dielectric 32 is removed during an ion etching process for removing the second dielectric 34 to expose the bottom surface of the second trench 31.

Figure 8:
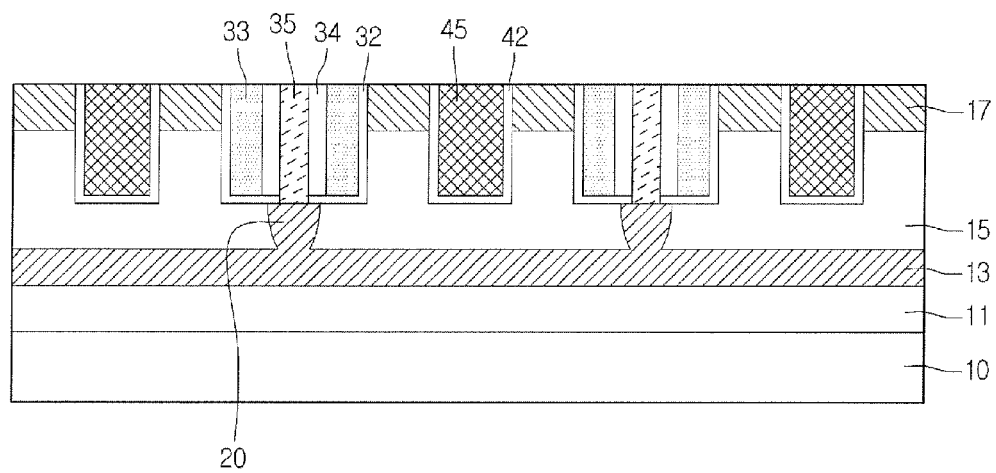

Referring to FIG. 8, the common drain 35 can be formed in the second trench 31. In one embodiment, the common drain 35 is formed by depositing a highly doped first conductive type polysilicon in the second trench 31. The first conductive type polysilicon can include a highly doped N-type polysilicon.

In an embodiment, the N-type polysilicon can be deposited in the second trench 31 using a CVD method such that the second trench 31 is filled with the N-type polysilicon to form the common drain 35. The N-type polysilicon remaining in a region except the common drain 35 can be removed using an ion etching method or a chemical mechanical polishing (CMP) method.

The second trench 31 is filled with the first conductive type polysilicon to form the common drain 35 between the gate electrodes 45. Accordingly, the common drain 35 can have an up-drain structure.

Since the common drain 35 has the up-drain structure, a transistor formed with the common drain 35 can have low output resistance and high frequency characteristic.

Referring to FIG. 9, first conductive type impurity ions can be implanted into the second conductive type shallow well 17 provided in an upper portion of the semiconductor substrate 10 to define a source region 60. Second conductive type impurity ions can be implanted at a side of the source region in the second conductive type shallow well 17 to define the body region 70.

In one embodiment, the first conductive type impurity ions of the source region 60 can include N-type impurity ions. The N-type impurity ions can be implanted into the second conductive type shallow well 17 such that the N-type impurity ions surround the gate electrode 45 to define the source region 60.

The second conductive type impurity ions of the body region 70 can include P-type impurity ions. The P-type impurity ions can be implanted into the second conductive type shallow well 17 to define the body region 70 between the source region 60 and the first dielectric 32 of the common drain 35.

As described above, when the first trench 41 for forming the gate has a hexagonal shape, the gate electrode 45 has the hexagonal shape. Furthermore, a gate cell including the source region 60, the body region 70, the first dielectric 32, the drain polysilicon layer 33, and the second dielectric 34 around the gate electrode 45 has the hexagonal shape.

Therefore, a plurality of gate cells having a hexagonal shape can be arranged in a manner such that adjacent gates cells are arranged around a given gate cell, and the common drain 35 having the up-drain structure is disposed between the gate cells to realize integration of the semiconductor device.

In the current embodiment, a process of forming the first conductive type buried layer 13 and processes of forming the first conductive type plug 20 and the second conductive type shallow well 17 can be performed together with processes of forming a CMOS transistor.

In addition, after the trenches 31 and 41 for forming the gate and the common drain 35 are formed, the remaining processes of the semiconductor device can also be performed together with the processes of forming the CMOS transistor.

Therefore, a trench MOS transistor including the common drain having the up-drain structure can be formed by adding a simple process.

Since the gate cells are arranged adjacent to each other, the semiconductor device is suitable for a transistor having a large current driving ability.

Although the gate cell has been described as including one gate electrode in a trench cell having the hexagonal shape, embodiments of the present invention are not limited thereto. For example, the gate cell can include a plurality of trench gates in the trench cell, thereby increasing its size.

As the trench MOS transistor can include at least one of a bipolar transistor, an Extended MOSFET, and a lateral DMOS except the CMOS transistor process, the trench MOS transistor can be formed in the same chip.

According to the semiconductor device and the method of fabricating the semiconductor device of an embodiment, the trench MOS transistor can be formed in the same chip as a CMOS transistor.

Since the common drain having the up-drain structure is formed, the trench MOS transistor can have low output resistance and high frequency characteristic.

Furthermore, the trench MOS transistor can be formed on the same substrate as a CMOS transistor at low costs.

Since the common drain is formed between gate electrodes, the current path can be very short, thereby achieving low output resistance using a small area.

The gate cell can have the hexagonal shape with the common drain formed between the gate electrodes, thus allowing the semiconductor device to be highly integrated.

Any reference in this specification to "one embodiment," "an embodiment," "exemplary embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with others of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
a first conductive type well in a semiconductor substrate;
a second conductive type well on the first conductive type well;
a first trench passing through the second conductive type well and a portion of the first conductive type well;
a gate in the first trench with a gate dielectric between the gate and the walls of the trench;
a first conductive type source region on the second conductive type well and surrounding a lateral surface of the gate;
a second conductive type body region on the second conductive type well and surrounding a lateral surface of the first conductive type source region;
a common drain provided between the gate and an at least one adjacent gate, wherein the common drain is connected to the first conductive type well and the common drain surrounds a lateral surface of the second conductive type body region;
a high-concentration first conductive type buried layer below the first conductive type well; and
a high-concentration first conductive type plug between the common drain and the first conductive type buried layer.

2. The semiconductor device according to claim 1, wherein the common drain is provided in a second trench, wherein the second trench passes through the second conductive type well and a portion of the first conductive type well.

3. The semiconductor device according to claim 2, wherein the second trench has a width ranging from about 1.5 to about 3 times the width of the first trench.

4. The semiconductor device according to claim 2, further comprising a first dielectric in the second trench between sidewalls of the second trench and the common drain.

5. The semiconductor device according to claim 2, further comprising: a first dielectric, a drain polysilicon, and a second dielectric consecutively provided in the second trench between the sidewalls of the second trench and the common drain.

6. The semiconductor device according to claim 5, wherein the gate dielectric and the first dielectric each comprises a thermal oxide layer.

7. The semiconductor device according to claim 6, wherein the second dielectric comprises an oxide layer.

8. The semiconductor device according to claim 1, wherein the common drain comprises a high-concentration first conductive type material.

9. The semiconductor device according to claim 1, wherein the common drain is in contact with the first conductive type well.

* * * * *